United States Patent [19]
Nanba et al.

[11] 3,990,799
[45] Nov. 9, 1976

[54] DIGITAL EXPOSURE METER

[75] Inventors: Yasuhiro Nanba, Sakai; Mashio Kitaura, Tondabayashi, both of Japan

[73] Assignee: Minolta Camera Kabushiki Kaisha, Japan

[22] Filed: Jan. 13, 1975

[21] Appl. No.: 540,347

[30] Foreign Application Priority Data
Jan. 14, 1974  Japan.................................. 49-7276
June 24, 1974  Japan................................ 49-72513

[52] U.S. Cl............................. 356/226; 354/23 D; 356/224; 356/228
[51] Int. Cl.² .......................................... G01J 1/44
[58] Field of Search ........... 356/226, 224, 227, 228; 354/23 D; 307/233 R; 328/2; 250/214 DC, 214 P

[56] References Cited
UNITED STATES PATENTS
| | | | |
|---|---|---|---|
| 2,501,547 | 3/1950 | Stimson .............................. | 356/228 |
| 3,818,495 | 6/1974 | Sagara et al. ..................... | 354/23 D |
| 3,828,253 | 8/1974 | Mori................................... | 356/226 |
| 3,836,262 | 9/1974 | Yata et al. ......................... | 356/226 |
| 3,876,876 | 4/1975 | Kitai et al. ........................ | 354/23 D |

*Primary Examiner*—John K. Corbin
*Assistant Examiner*—Stewart Levy
*Attorney, Agent, or Firm*—Craig & Antonelli

[57] ABSTRACT

In an exposure meter having a row of lighting elements, such as lamps or light-emitting diodes, which correspond to respective exposure values, an improvement is made in that by utilizing a capacitor-charging integrating circuit, a constant current circuit and a ring-counter, an exposure value between two neighboring steps of the above-mentioned exposure values can be indicated by lighting said two lighting elements, and in that ranges of exposure indication can be switched by shifting a dial plate, which is facing the lighting elements, in interlocking relation with a range-shifting switch for switching its circuit for range selection, thus enabling a doubling of the steps of exposure values to be indicated with a limited number of lighting elements.

15 Claims, 9 Drawing Figures

DIGITAL EXPOSURE METER

BACKGROUND OF THE INVENTION

This invention relates to an improvement in a digital-type exposure meter for photography.

Hitherto, as exposure meters for photographic use, analogue-type devices having an ammeter for indicating the exposure value have been generally used. Recently, as a result of rapid development of integrated circuits, digital-type exposure meters having several lamps or light-emitting diodes for indicating exposure values are becoming more and more popular. One example of such conventional digital-type exposure meters is shown in U.S. Pat. No. 3,807,879 to Mori.

In such a conventional digital-indication type exposure meter, the exposure values to be indicated are discrete, for instance, at 2 times, 4 times, 8 times, ... and each value is respectively indicated by each corresponding lamp or light-emitting diode. In the circuitry for providing digital values of exposure steps, the above-mentioned prior art comprises a row of resistors of predetermined resistances corresponding to steps of exposure values. Such resistors of specified resistances are required to be precise, and therefore, are expensive.

SUMMARY OF THE INVENTION

This invention purports to obtain an improved digital exposure device, wherein the digital indication is made by an improved circuit dispensing with the high precision resistors.

DETAILED DISCLOSURE OF THE INVENTION

Figure 1:
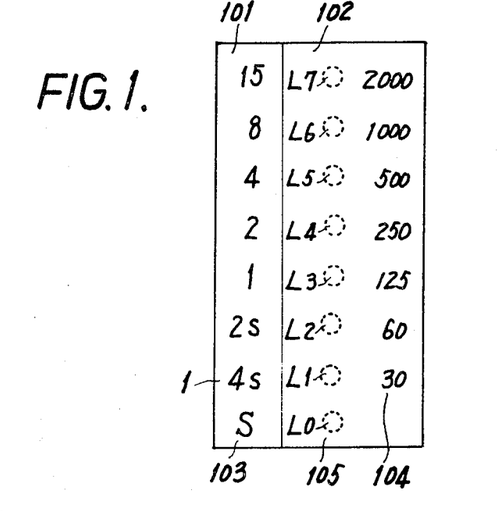
FIG. 1 is a front view of a dial plate according to the present invention.

In FIG. 1, which shows a dial plate of the exposure meter according to the present invention, the dial plate 1 comprises two rows of numerals disignating shutter speeds utilized in photography. The first row 103 of numerals is for slower shutter speeds, and is provided on an opaque part 101 of the dial plate 1 in transparent figures, comprising numerals 15, 8, 4, 2, 1, 2s, 4s and S which denote 1/15 sec., one-eighth sec., one-fourth sec., one-half sec., 1 sec., 2 secs., 4 secs., and an over-exposure warning, respectively. The second row 104 of numerals is for higher shutter speeds, and is provided on a transparent part 102 of the dial plate 1 in opaque figures, comprising the numerals 2,000, 1,000, 500, 250, 125, 60 and 30 which denote 1/2,000 sec., 1/1,000 sec., 1/500 sec., 1/250 sec., 1/125 sec., 1/60 sec., and 1/30 sec., respectively.

The dial plate 1 is slidingly disposed to be slidable in a direction at right angles to the direction of the rows 103 and 104 in relation with a row 105 of light paths L0 to L7 of lighting means. For indicating higher shutter speeds, the dial plate 1 is moved leftwardly, so that the numerals of the row 104 for higher speeds are placed closely adjacent to the corresponding light paths L0 to L7 as shown by dotted circles in FIG. 1. On the other hand, for indicating lower shutter speeds, the dial plate 1 is slid rightwardly, so that the transparent figures of numerals of row 103 of the lower shutter speeds, provided on the opaque part 101 are in the light path L0 to L7 in such a manner that a numeral, or numerals, of the row 103 is illuminated by the light when the corresponding lighting element, or elements, is energized.

Figure 2:
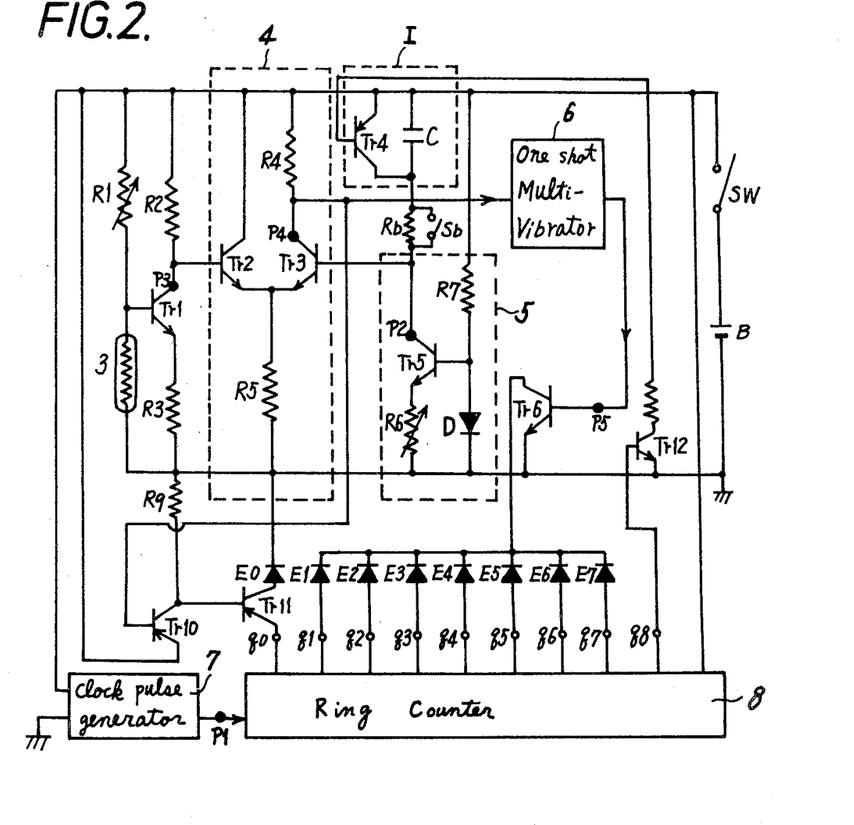
FIG. 2 is a circuit diagram of one example of the present invention.

A circuit for operating the lighting elements in response to measured brightness is elucidated hereunder by reference to FIG. 2.

In FIG. 2, a first transistor Tr1 constitutes an amplifier together with the collector-load resistor R2 and the emitter-bias resistor R3, and amplifies divided voltage at a voltage-dividing point of a voltage-dividing circuit. The voltage-dividing circuit consists of a series connection of a variable resistor R1 for setting conditions such as film sensitivity and/or aperture stop and a photoconductor 3 for measuring brightness, and the voltage-dividing circuit is connected across positive and negative terminals of a D.C. power source B through a power switch SW. The transistor Tr1 provides input signals to the base of a transistor Tr2 of a known comparison circuit, i.e., a differential amplifier 4 which comprises transistor Tr3 having common emitter-resistor R5 with the transistor Tr2. Instead of the photoelectric conversion circuit consisting of a series connection of the variable resistor R1 and the photoconductor 3 as above-mentioned, known photo-measuring circuits can be employed having at least one photosensitive element, which circuits are capable of producing voltage signals proportional to the logarithm of input brightness, such as shown in U.S. Pat. No. 3,752,045 (Ono et al), German Laying-Open Patent Gazett No. 2,117,532 (Watanabe et al), U.S. Pat. No. 3,728,946 (Kuramoto et al) or U.S. Pat. No. 3,783,758 (Tsujimoto et al).

Further, in FIG. 2, the capacitor C and a transistor Tr4 with its emitter and collector connected to both ends of the capacitor C constitute an integrating circuit I. A transistor Tr5, with its emitter connected to a variable resistor R6, and with its base connected to a junction point in a series connection of the resistor R7 and a diode D, constitutes a constant-current circuit 5. Other known constant current circuits may be employed in place of the above-mentioned constant current circuit 5. The integrating circuit I and the constant current circuit 5 are connected in series through a bias-switching circuit comprising a biasing resistor Rb and a range-shifting switch Sb. This series connection is connected across both ends of the power source B, so that the capacitor C is charged by a constant current fed through the collector P2 of the transistor Tr5.

The integrating circuit I and the constant current circuit 5 together constitute a voltage sweeping circuit. The range-shifting switch Sb is interlocked with the sliding movement of the dial plate 1 in a manner that the switch Sb is closed when the dial plate 1 is slid leftward, and is opened when slid rightward. The collector P2 of the transistor Tr5 is connected to the base of the transistor Tr3 of the differential amplifier 4, so that the output voltage of the integrating circuit I is given as a second input to the differential amplifier 4. The transistor Tr4 in the integrating circuit I resets the charging of the capacitor C by shortcircuiting it upon receiving a pulse signal at its base.

The collector P4 of the transistor Tr3 of the differential amplifier 4 is connected to the input terminal of a one-shot multi-vibrator 6, which applies its output signal to the base of an emitter-grounded driving transistor Tr6. The collector of the transistor Tr6 is connected in common to cathodes of light-emitting diodes (hereinafter referred to as LEDs) E1, E2, ..., and E7, and anodes of these LEDs are connected, respectively, to output terminals $q1, q2, \ldots$, and $q7$ of a known ring-counter 8.

The anode of a LED E0 is connected through the collector-emitter circuit of a transistor Tr11 to the output terminal $q0$ of the ring-counter 8, and the cathode of the LED E0 is grounded. The base of the transistor Tr11 is connected to the collector of a transistor Tr10, the emitter of which is connected to the positive end of the power source through the power switch SW, and the base of which is connected to the collector P4 of the transistor Tr3, i.e., the output terminal of the differential amplifier 4. Input terminal P1 of the ring-counter 8 is connected to the output terminal of a clock-pulse generator 7. An output terminal $q8$ of the ring-counter 8 is connected to the base of a transistor Tr12, the collector of which is connected through a resistor R10 to the base of the transistor Tr4, so as to provide a reset pulse thereto.

Figure 3:
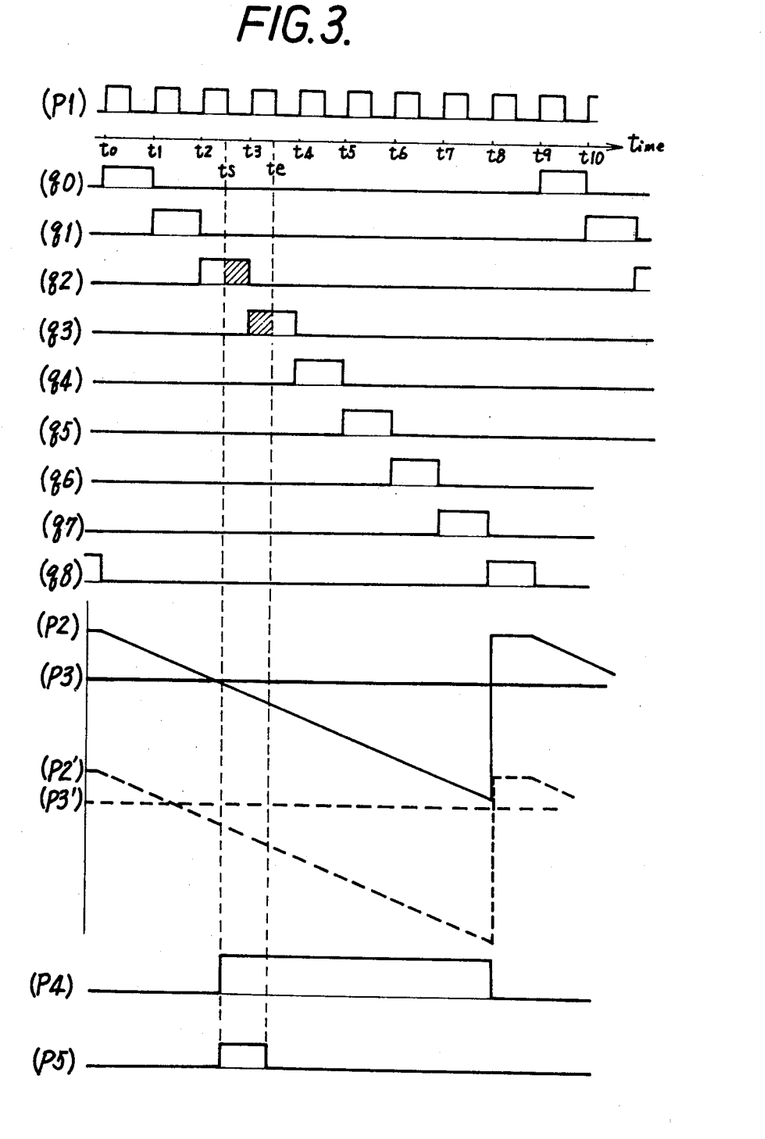
FIG. 3 is a time chart showing wave forms of signals at various parts of the circuit of FIG. 2.

FIG. 3 is a time chart showing signal wave forms of the terminals and points P1, P2... P5 in the circuit of FIG. 2. In FIG. 3, the wave forms are indicated by reference indicia identical to the indicia indicated in the circuit.

Operation of the above-mentioned circuit is elucidated in the following.

In accordance with conditions such as film sensitivity, stop value, etc., the variable resistor R1 is preliminarily set to a certain value, so that a base bias current of the transistor Tr1 is preliminarily set. Then, upon closing the power switch SW, a voltage responding to the intensity of light incident from photographic object to the photosensitive element 3 is applied to the base of the transistor Tr1, and as a result, a voltage responding to the light intensity, i.e., brightness of photographic object, is applied to the base P3 of the transistor Tr2.

On the other hand, the clock-pulse generator 7 generates clock-pulses as shown by FIG. 3(P1) and supplies them to the ring-counter 8. The output terminals $q0, q1, q2, q3, q4, q5, q6, q7$ and $q8$ in turn send "1" pulses, thereby being in an "ON" state in sequence, as shown by FIG. $3(q0) - (q8)$, and said 1 pulse width is equal to the periods of the clock-pulses, respectively. When the output terminal $q8$ becomes ON, a pulse ($q8$) of FIG. 3 is applied to the base of the transistor Tr4, so that the transistor Tr4 is made conductive and discharges the charge in the capacitor C. When the next pulse is applied to the ring-counter 8, then the terminal $q8$ is turned off, and resultantly, the transistor Tr4 is turned off, thereby charging the capacitor C by a constant current flowing through the constant-current circuit 5. In accordance with this charging, the potential at the base P2 of the transistor Tr3 declines as shown by FIG. 3 (P2).

As has been described, the potential at the base of the transistor Tr2 is defined by the setting of the variable resistor R1 and the intensity of the light incident to the photo-sensitive element 3, and is constant, as shown by FIG. 3 (P3), when these conditions are constant. The potential at the collector P4 of the transistor Tr3, namely, the output terminal of the differential amplifier 4 is increased, as shown by FIG. 3 (P4), when the potential at the point P2 crosses or equals the potential at the point P3, and the increased potential P4 is applied to the one-shot multi-vibrator 6, which resultantly sends a pulse of a specified pulse width, as shown by FIG. 3 (P5), to the base of the transistor Tr6.

Accordingly, the transistor Tr6 is made ON during the pulse width of the pulse of FIG. 3 (P5). Therefore, any lighting element or lighting elements E1 to E7, which are connected to the output terminals $q1$ to $q7$ that becomes ON during the above-mentioned ON period of the transistor Tr6, are lit. In the example of FIG. 3, the potentials of the points P2 and P3 become equal at the time ts, and the transistor Tr6 is made ON between the times $ts$ and $te$. Accordingly, the lighting element E2 is lit from the time $ts$ to the time $t3$, and the lighting element E3 is lit from the time $t3$ to the time $te$. Namely, the lighting elements E2 and E3 are lit during the periods while the pulse width of the pulse of FIG. 3 (P5) coexists with the pulse widths of the pulses $q2$ and $q3$, respectively. In this example, the time ts, when the potentials at the points P2 and P3 cross each other, is within the pulse width of the pulse of FIG. 3 ($q2$), and accordingly, the lighting elements E2 and E3 are sequentially lit. This indicates that the measured exposure is a value between two values indicated by the lighting elements E2 and E3.

At the time t8, the pulse of FIG. 3 ($q8$) is sent from the output terminal $q8$ to the base of the transistor Tr4, and therefore, the capacitor C is discharged and the circuits are reset. Then, the next cycle of the ring-counter 8 takes place. Under the same conditions, in subsequent cycles of the ring-counter, the same lighting elements E2 and E3 are lit cyclically.

Increase or decrease of the incident light causes the shifting to advance or lag with respect to the crossing time ts, accordingly, the proportion of the pulse widths of lighting currents in the lighting elements E2 and E3 changes. By selecting the frequency of the clock pulse to be very short so as not to give flickering to human eyes, any lighting element or elements cyclically lit can be observed as if continuously lit. Therefore, in case the two lighting elements are lit in sequence, the user of this apparatus can know that the desirable exposure value is between the two values indicated by the two lighting elements, and moreover, by means of proportions of lighting intensities of the elements, he can know at which part the indicated value lies between the two values.

Figure 4:
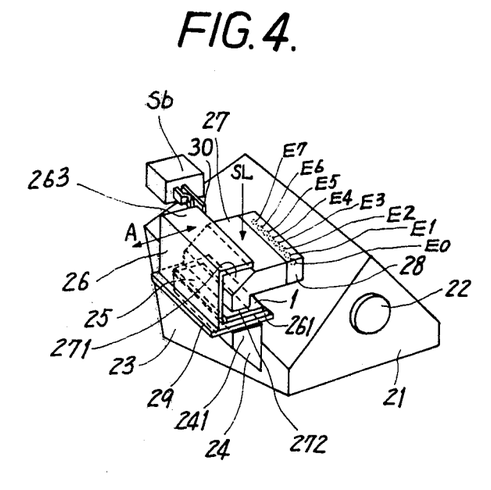
FIG. 4 is a perspective view of a principal part of the apparatus of the present invention.

The mechanical constitution of this exposure meter is as follows. In FIG. 4, which is a perspective view of the principal part of the apparatus of the present invention, a small additional prism 24 is attached to a side face of a known penta-prism 21. An eye piece lens 22 is attached to the rear face of the pentagonal prism 21. A guide frame 26 is secured on the upper face 241 of the additional prism 24. The frame 26 holds the dial plate 1 on its lower table 261, and is slidingly disposed on the guide frame 29 in a manner to slide sideways (from left to right and vice versa) as shown by an arrow A. The lower table 261 has a hole 262 to allow light to pass therethrough into the additional prism 24. A shading wing 263 is provided on the frame 26. A light-guide 27 having a total-reflection face 271 is disposed in a frame in a manner that the frame 26 and the dial plate 1 can be slid freely from the light-guide 27. A row of the lighting elements E0, E1, E2, E3, E4, E5, E6 and E7 are disposed on a side face of the light guide 27, so that lights from the lighting elements are reflected by the total reflection face 271 and are projected to the dial plate 1 and further to the additional prism 24.

An engaging tab 30 of the range-shifting switch Sb is disposed in such a position as to be pushed by, for instance, the shading wing 263 to open the switch Sb when the frame 26 is slid rightward for measuring dark objects.

The operation of the mechanical part is as follows.

Figure 5:
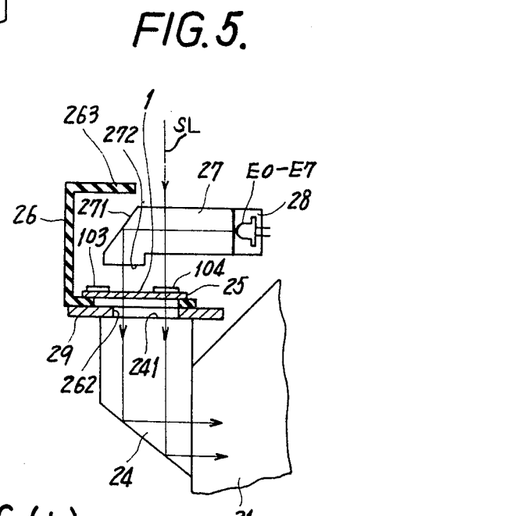
FIG. 5 is a side-sectional view of a principal part shown in FIG. 4, FIG. 6, (a) and (b) are images seen from the eyepiece lens 22, wherein exposure values are indicated on a side of a frame of photographic view finder.

In general daylight photographing, or for bright photographic objects, the dial plate 1 is slid to leftward by sliding the frame 26 leftwardly. Then, as shown by FIG. 5, light SL from a skylight passes through the light-guide 27 and illuminates the numerals 104 for higher shutter speeds. By being illuminated, the light images of the numerals are brought through the additional prism 24 into the pentagonal prism 21. On the other hand, light emitted from the lighting elements are brought through the light-guide 27 and are also brought into the pentagonal prism 21 through the additional prism 24. Thus, by means of conventionally integrating the light paths, the image observed through the eye piece lens 22 is formed as shown in FIG. 6(a), wherein on one side of a photographic scenery 300 in the finder frame are the row of illuminated numerals 104 and the row 105 of the image of the lighting elements. Thus, by lighting of one or two light elements, the measured exposure is indicated. FIG. 6(a) shows an example of the shutter speed of 1/125 second.

For dark photographic objects, the frame is slid rightwardly, so that the light paths 105 of the lighting elements pass the transparent figures of numerals 103 for lower shutter speeds.

Figure 6:
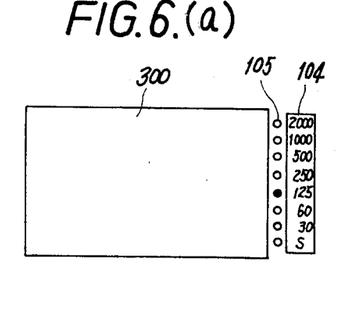

Therefore, any one or two of the numerals in the row 103 for slower speeds are illuminated by the light, or lights, from the lighting elements when lit. FIG. 6 (b) shows an example wherein a slow exposure of 4 seconds is indicated. Simultaneously with the above-mentioned rightward sliding of the frame 27, the engaging tab 30 of the range-shifting switch Sb is pushed by an end of the shading wing 263 of the frame, and the range-shifting switch Sb is opened. By the opening of the switch Sb, the series resistor Rb is inserted between the capacitor C and the point P2, and accordingly, the potential at the point P2 becomes biased lower by a specified bias voltage, as shown by dotted curve in FIG. 3 (P2′). Since the potential at the point P2 is so biased in the lower levels, the lower potential at the point P3, shown by lower dotted line (P3′) in FIG. 3, corresponding to the lower brightness, can be compared by the differential amplifier 4. Thus, the lighting elements E1 to E7 indicate measured exposures in the lower brightness range.

When the brightness is too high to be indicated by the row 104 of numerals for lower speeds, the potential at the point P3 of FIG. 2 is high as shown by solid line (P3) in FIG. 3, so that the solid line (P3) does not cross the dotted oblique line (P2′) in FIG. 3. In this case, the potential at the point P4 becomes low. In this case, no lighting element out of E1 to E7 is lit, but the potential at the point P4 is low, hence making the transistors Tr10 and Tr11 ON. Therefore, the lighting element E0 for indicating the mark S on the dial plate 1 is lit.

As stated in the above, this mark S when lit by the lighting element E0 indicates that the brightness is too high for indicating in the low speed numeral range, and therefore, the user is warned to slide the dial plate 1 leftward by sliding the frame 26 leftward. By means of this sliding, the row 104 of higher speed numerals on the dial plate 1 is brought immediately under the light path of the lighting elements, and the shading wing 263 uncovers the above-mentioned light path SL, letting the skylight to the additional prism 24.

Simultaneously with the above-mentioned leftward sliding of the frame 26, the range-shifting switch Sb is closed. By the closing of the switch Sb, the series resistor Rb is shortcircuited, and accordingly, the bias voltage of the potential at the point P2 is eliminated, and the potential at the point P2 is increased as shown by solid curve (P2) in FIG. 3, so that the solid line (P3) crosses the solid curve (P2).

Figure 7:
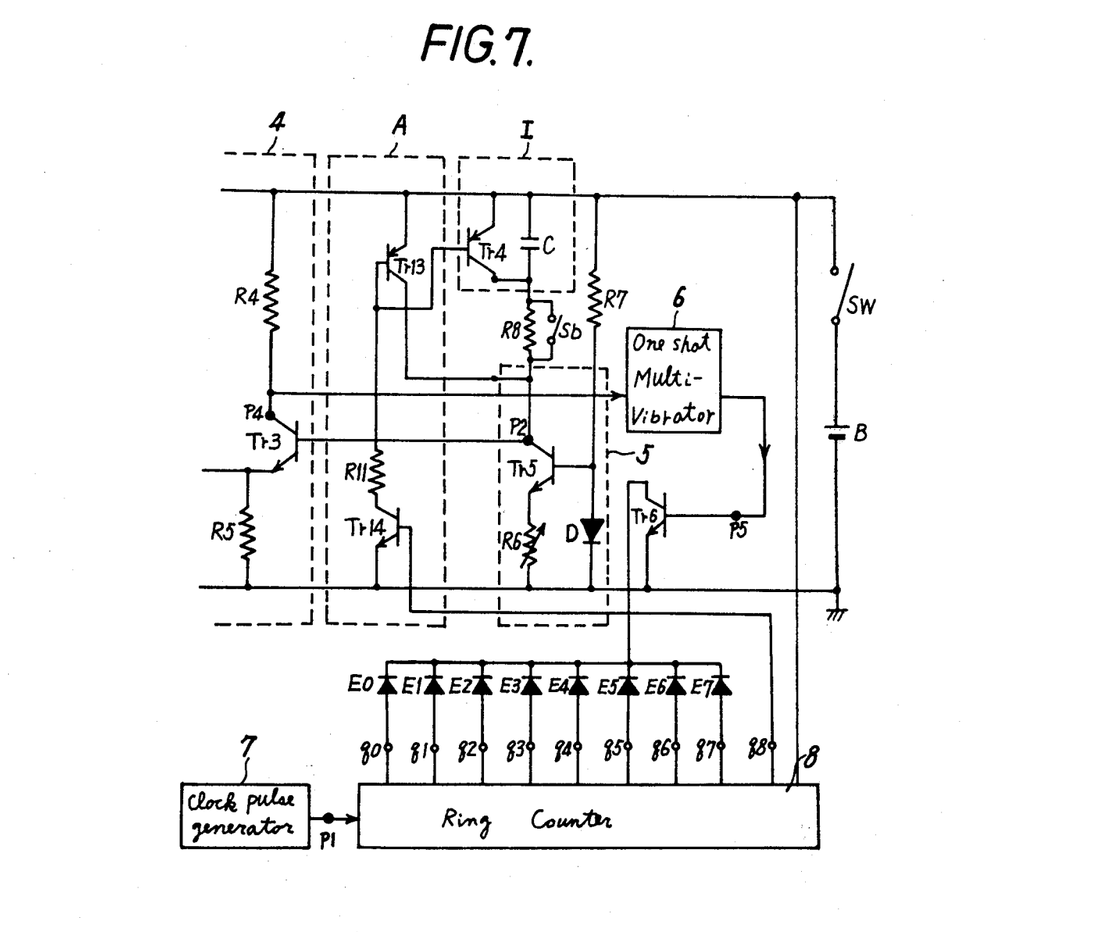
FIG. 7 is a circuit diagram showing a variation to the circuit shown in FIG. 2.

A variation to the circuit of FIG. 2 is shown in FIG. 7, wherein an additional circuit A, comprising transistors Tr13 and Tr14 and a resistor R11, is connected to the differential amplifier 4, the integrating circuit I and the constant current circuit 5 of the previously shown circuit in FIG. 2, thereby eliminating the transistor Tr12 of FIG. 2. In the circuit A, the transistor TR14 is connected by its base to the output terminal q8 of the ring-counter 8, by its emitter to ground and by its collector through the resistor R11 to the bases of the transistor Tr13 and the transistor Tr4. The collector of the transistor Tr13 is connected to the collector P2 of the transistor Tr5, and the emitter of the transistor Tr13 is connected to the positive end of the power source. The resistor R8 and the range-shifting switch Sb remain the same as in FIG. 2. The lighting element E0 is connected between the first output terminal q0 and the collector of the transistor Tr6, and the transistors Tr10 and Tr11 shown in FIG. 2 are omitted in the case of FIG. 7.

Figure 8:
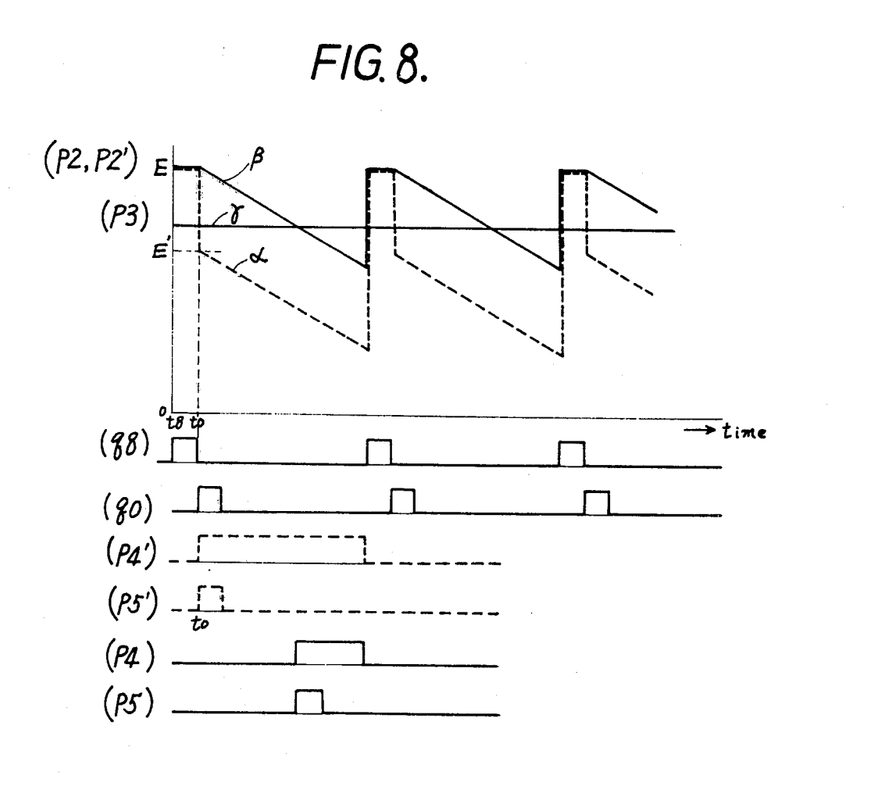
FIG. 8 is a time chart showing wave-forms in the circuit of FIG. 7.

The operation of the circuit of FIG. 7 is as follows:

1. In the case where the range-shifting switch Sb is closed:

When an output pulse of a high level is sent out at the time t8 in FIG. 8 from the output terminal q8 of the ring-counter 8, the transistor Tr14 is made ON, and hence, the transistors Tr13 and Tr14 are made ON. Therefore, by the transistor Tr13 the capacity in the capacitor C is discharged for resetting, and the potential at the point P2 is raised to E that of the positive end of the power source B. Upon decrease of the output pulse from the terminal q8 at the time t0, the transistors Tr14, Tr4 and Tr13 are made "OFF", and the capacitor C starts to be charged. Thus, the potential at the point P2 varies along a solid curve B shown in FIG. 8 (P2,P2′).

2. In the case where the range-shifting switch Sb is opened:

When an output pulse of a high level is sent out at the time t8 from the output terminal q8 of the ring-counter 8, the transistor Tr14, as well as the transistors Tr13 and Tr4, are made ON. Therefore, the capacity of the capacitor C is discharged, and the potential at the point P2 is raised to E that of the positive end of the power source B. Upon the decrease of the output pulse from the terminal q8 at the time t0, the transistors Tr14, Tr4 and Tr13 are made OFF, and the capacitor C starts to be charged through the resistor R8. On account of a voltage drop caused by the constant current flowing through the resistor R8, the potential at the point P2 is lowered to a potential E' at the time t0 as shown in FIG. 8 (P2, P2'). The voltage drop E-E' is given by the product of the constant current and the resistance of the resistor R8. Thus, the potential at the point P2 varies along a dotted curve a as shown in FIG. 8.

As shown in FIG. 8 (P2, P2'), the potential in an oblique part (charging period) of the curve a for the case where the switch Sb is opened is lowered by the voltage E-E' from an oblique part (charging period) of the curve B for the case where the switch Sb is closed.

Indicating function for a range-shifting in the embodiment of FIG. 7 is as follows:

Provided that the range-shifting switch Sb is opened by selecting a low-speed range and that potential at the point P3 is at a high level such as shown by the line γ in FIG. 8, the potential level being for a bright photographic object to be measured in the high speed range, then, as mentioned above, the potential at the point P2 decreases at the time t0 from level E to the level E'. During this decrease, the curve α crosses the line γ, namely, the potential P2 passes the potential of P3 at the time t0, and therefore, the one-short multi-vibrator 6 is triggered at the time t0 to give a pulse P5' shown by FIG. 8 (P5'), and the transistor Tr6 is made ON for a short period which coincides with the period of the output pulse from the output terminal q0. Therefore, the lighting element E0 is lit during this period.

Thus, the lighting element E0 of FIG. 7 is lit in such cases where the low-speed range, wherein the range-shifting switch Sb is opened, is selected and where a photographic object is suitable for a measurement in the high-speed range. In other words, the lighting element E0 is lit when range-shifting is necessary from the low-speed range to the high speed range.

Many variations can be made in embodying the present invention. For instance, interchanging the positions of the intergrating circuit I and the constant-current circuit 5 will invest the gradient of the oblique part of the curves of the potential at the points P2 of FIG. 3 (P2) and FIG. 8 (P2, P2'). In such varied embodiments, indication or warning for range-shifting to lower speed range can be obtained by a lighting element connected to the output terminal q0 of the ring-counter 8.

In the present invention, a precise saw-tooth wave with satisfactory linearity is obtainable by utilizing the integrating circuit I and the constant current circuit 5, and by sampling the precise saw-tooth wave with clock pulses, a high precision meansurement of the potential across the photosensitive element 3 can be obtained. Thus, the circuit of the present invention dispenses with expensive rows of precision-made resistors such as are used in the prior art.

While We have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What is claimed is:

1. An exposure meter for digital indication based on an analogue signal produced by photoelectric measuring of brightness, which comprises:
   a photoelectric circuit having a photosensitive element for producing a first analogue signal corresponding to brightness of an object;
   signal producing means having a plurality of output terminals for sequentially producing an output signal at each of said output terminals, said output signal being cyclically applied in sequence to said plurality of output terminals with a predetermined period,
   a plurality of light emitting elements, each of which is electrically related with a respective one of at least a part of said plurality of output terminals;
   first means for producing an electric signal having a predetermined pulse width less than said predetermined period within every cycle of said predetermined period;
   time-determining means responsive to said first analogue signal for determining a time interval from an initiation of said predetermined period to occurrence of said electric signal independently of the sequential output signals produced by said signal producing means; and
   second means for at least partially energizing at least one of said light emitting elements when said output signal is produced at the respective ones of said output terminals and when said electric signal is produced.

2. An exposure meter according to claim 1, wherein two adjacent light emitting elements are at least partially energized when said output signal is applied sequentially to the respective adjacent output terminals within said predetermined pulse width of said electric signal.

3. An exposure meter according to claim 1, wherein said signal producing means comprise a clock-pulse generator and a ring-counter for continuously counting pulses of said clock-pulse generator, and said time-determining means comprise third means for producing a second analog signal having a varying amplitude within said predetermined period and fourth means for comparing said first and second analogue signals, said fourth means controlling said first means when a predetermined relationship exists between said first and second analogue signals.

4. An exposure meter according to claim 3, further comprising
   fifth means for biasing said second analogue signal in the entire range of said predetermined period.

5. An exposure meter according to claim 3, further comprising
   sixth means for producing a warning signal when said first and second analogue signals are outside of said predetermined relationship, and
   seventh means for warning when said sequential output signal is produced at a predetermined one of said output terminals, when said warning signal is produced.

6. An exposure meter according to claim 3, further comprising eighth means for biasing said second analogue signal when said output signal is produced at a predetermined one of said output terminals.

7. An exposure meter according to claim 3, wherein said predetermined relationship occurs when said first and second analogue signals are essentially equal.

8. An exposure meter for digital indication based on an analogue electric signal produced by photoelectric measuring of brightness, which comprises:

a photoelectric circuit having a photosensitive element for producing an electric signal corresponding to brightness of an object, an integrating circuit comprising a capacitor and a switching element, both terminals of said capacitor being connected to said switching element for discharging for resetting charge in said capacitor, a constant current circuit connected for applying a constant current to said integrating circuit, said integrating circuit and said constant current circuit together constituting a voltage sweeping circuit, a voltage comparator circuit which produces an output signal when the voltage of said electric signal from said photoelectric circuit and that of a signal from said voltage sweeping circuit coincide with each other, a switching circuit which is ON for a preset period when triggered by said output signal from said voltage comparator circiut.

a ring-counter having a row of output terminals being sequentially in the ON state, wherein the periods between shiftings of said ON states from one terminal to the next terminal are controlled by a specified clock pulse from a clock-pulse generator, a selected one of said output terminals being connected to an input terminal of said switching element in said integrating circuit to make said switching element ON upon receiving an output signal from said selected output terminal, and a set of light producing elements, each of which is connected by one end to respective ones of the rest of said output terminals of the ring counter and by the other end in common to an output terminal of said switching circuit, wherein at least one of said light producing elements is at least partially lit when both said switching circuit and the respective one of said output terminals are in the ON state.

9. An exposure meter according to claim 8, wherein two adjacent light producing elements are at least partially lit when the respective adjacent output terminals connected to said two light producing elements are sequentially in the ON state during the period of said switching circuit being in the ON state.

10. An exposure meter according to claim 8, which further comprises a light producing element for providing a warning of the inappropriateness of the range selected.

11. An exposure meter according to claim 6, wherein said photoelectric circuit produces an electric signal which is proportional to the logarithm of said brightness.

12. An exposure meter according to claim 8, wherein said switching circuit comprises a one-shot multi-vibrator which produces a pulse with a pulse width almost equivalent to the period between the shiftings of said ON states, and a switching element controlled by said pulse.

13. An exposure meter according to claim 8, wherein said photoelectric circuit produces an electric signal which is proportional to the logarithm of said brightness.

14. An exposure meter according to claim 8, which further comprises:

a dial plate having two rows of indicia for indicating exposure values, said dial plate being slidingly situated in a manner that by sliding the dial plate in opposite directions at a right angle to the directions of the rows, one row of said indicia is selectively positioned in relation to a row of light paths of said light producing elements, the light images of said indicia and the light producing elements corresponding thereto being observed in an image field of a view finder, and a range shifting switch being linked to the sliding dial plate in such an interlocked relation that said sliding of the dial plate switches a biasing means connected to the intergrating circuit, said biasing means biasing the intergrated value by a specified value when connected.

15. An exposure meter according to claim 14, wherein the dial plate comprises:

a first row of transparent indicia for indicating lower shutter speeds on an opaque background, and a second row of opaque indicia for indicating higher shutter speeds on a transparent background, said dial plate being arranged to be slidable such that for indication of lower shutter speeds the lights of the light producing elements illuminate the transparent figures and that for higher shutter speeds the lights of the light producing elements and indicia images illuminated by ambient light are observed side by side.

* * * * *